US009000714B2

(12) United States Patent
Mun et al.

(10) Patent No.: US 9,000,714 B2
(45) Date of Patent: Apr. 7, 2015

(54) PHOTOVOLTAIC MODULE

(75) Inventors: Hyunrok Mun, Seoul (KR); Myonghwan Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 430 days.

(21) Appl. No.: 13/455,731

(22) Filed: Apr. 25, 2012

(65) Prior Publication Data

US 2012/0274264 A1 Nov. 1, 2012

(30) Foreign Application Priority Data

Apr. 26, 2011 (KR) .......................... 10-2011-0038842

(51) Int. Cl.
H01R 13/62 (2006.01)
H02S 40/32 (2014.01)
H02S 40/34 (2014.01)

(52) U.S. Cl.
CPC ............... H02S 40/345 (2014.12); H02S 40/32 (2013.01); H02S 40/34 (2013.01)

(58) Field of Classification Search
USPC ................................................. 320/100–106
See application file for complete search history.

(56) References Cited

U.S. PATENT DOCUMENTS

| 8,749,218 | B2 * | 6/2014 | Mateu et al. | 323/284 |
| 2010/0001587 | A1 * | 1/2010 | Casey et al. | 307/80 |
| 2011/0061705 | A1 | 3/2011 | Croft et al. | |
| 2011/0083733 | A1 | 4/2011 | Marroquin et al. | |
| 2011/0291606 | A1 * | 12/2011 | Lee | 320/101 |

FOREIGN PATENT DOCUMENTS

| EP | 1263039 | 12/2002 |
| EP | 2273561 | 1/2011 |

\* cited by examiner

*Primary Examiner* — Binh Tat
(74) *Attorney, Agent, or Firm* — McKenna Long & Aldridge LLP

(57) ABSTRACT

A photovoltaic module includes: a solar cell module including a plurality of solar cells; a junction box including a dc/dc converter unit to convert the level of DC power supplied from the solar cell module; a plate on one surface of the solar cell module and disposed between the solar cell module and the junction box; and a coupling member attaching and detaching the junction box from the solar cell module.

20 Claims, 13 Drawing Sheets

50

50

PHOTOVOLTAIC MODULE

CROSS-REFERENCE TO RELATED APPLICATION

This application claims the priority benefit of Korean Patent Application No. 10-2011-0038842, filed on Apr. 26, 2011, in the Korean Intellectual Property Office, the disclosure of which is incorporated herein by reference.

BACKGROUND

1. Field of the Disclosure

The present disclosure relates to a photovoltaic module (or a solar module) and, more particularly, to a photovoltaic module capable of replacing a junction box attached to the photovoltaic module.

2. Description of the Related Art

Recently, as existing energy resources such as oil or coal are expected to be exhausted, an interest in alternative energy for replacing oil or coal is increasing. In particular, a solar cell which directly converts (or transforms) solar energy into electric energy by using a semiconductor element is getting the spotlight as a next-generation cell.

Meanwhile, a photovoltaic module refers to a device in which solar cells for photovoltaic power generation are connected in series or in parallel, and the photovoltaic module may include a junction box collecting electricity produced by the solar cells.

SUMMARY

One aspect provides a photovoltaic module capable of easily attaching or detaching a junction box in the photovoltaic module.

Another aspect provides a photovoltaic module including a converter unit to convert the level of DC power in a junction box attached to a photovoltaic module.

According to another aspect, there is provided a photovoltaic module including: a solar cell module including a plurality of solar cells; a junction box including a dc/dc converter unit to level-convert DC power supplied from the solar cell module; a plate on one surface of the solar cell module and disposed between the solar cell module and the junction box; and a coupling member attaching and detaching the junction box from the solar cell module.

DETAILED DESCRIPTION

Exemplary embodiments of the present invention will now be described in detail with reference to the accompanying drawings.

In the following description, usage of suffixes such as 'module', 'part' or 'unit' used for referring to elements is given merely to facilitate explanation of the present disclosure, without having any significant meaning in itself. Thus, the 'module' and 'part' may be interchangeably used.

Figure 1:
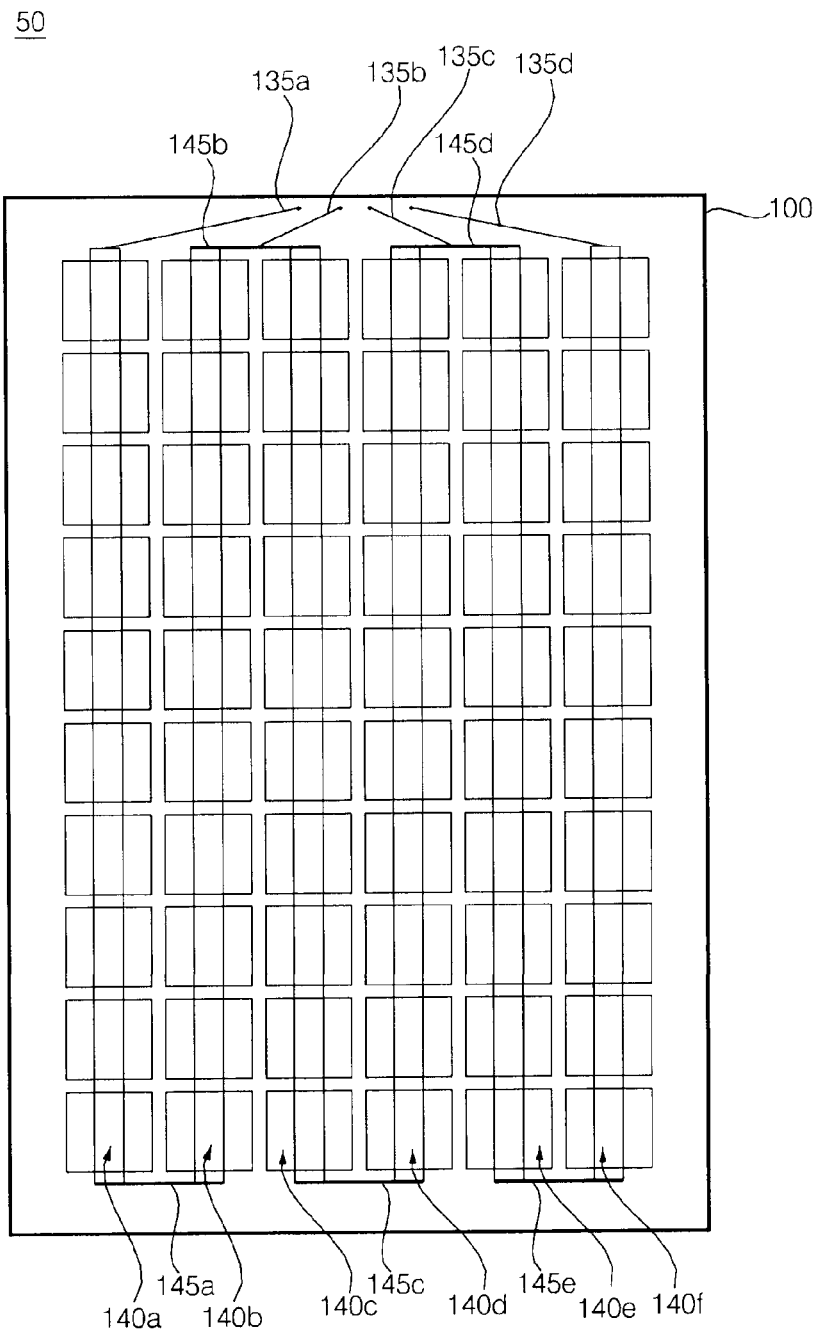
FIG. 1 is a front view of a photovoltaic module according to an embodiment of the present invention.
Figure 2:
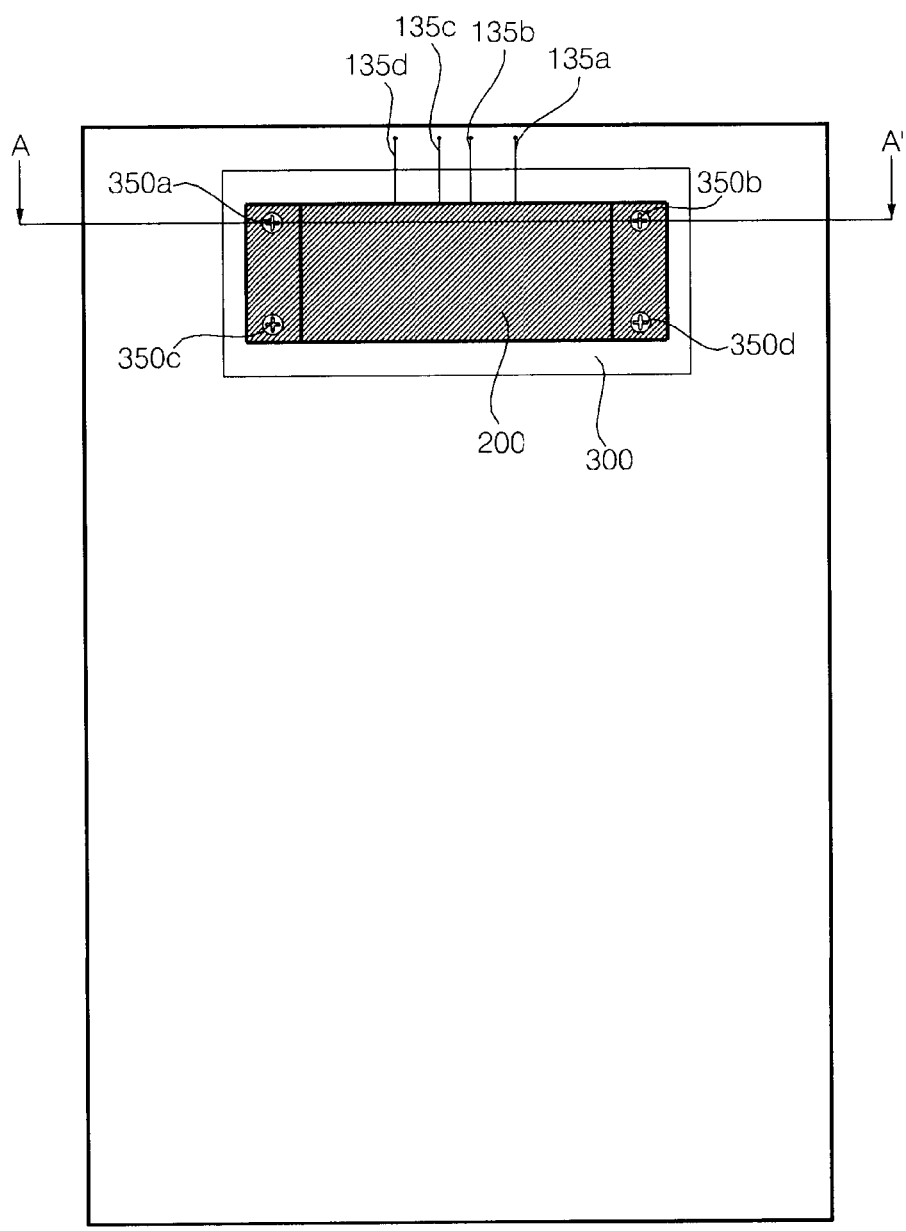
FIG. 2 is an example illustrating a rear view of the photovoltaic module of FIG. 1.

FIG. 1 is a front view of a photovoltaic module according to an embodiment of the present invention; FIG. 2 is an example illustrating a rear view of the photovoltaic module of FIG. 1, and FIG. 3 is an exploded perspective view of the photovoltaic module of FIG. 1.

Figure 3:
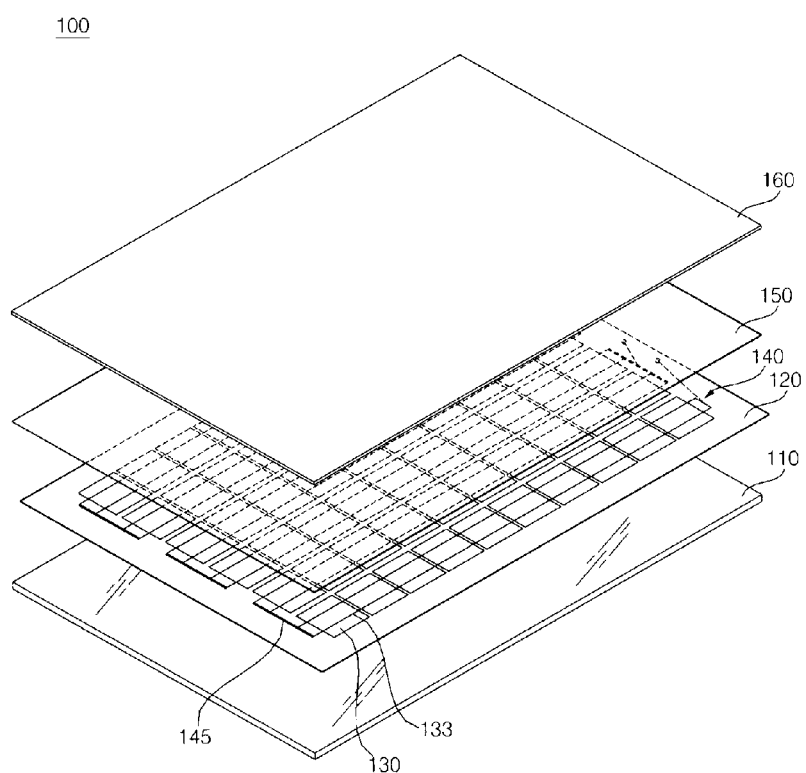
FIG. 3 is an exploded perspective view of the photovoltaic module of FIG. 1.
Figure 4:
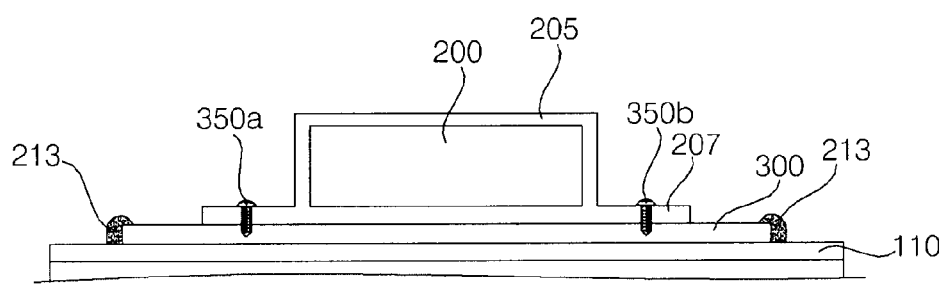
FIG. 4 is an example illustrating a cross-sectional view taken along line A-A' of the rear of the photovoltaic module of FIG. 2.

With reference to FIGS. 1 to 3, a photovoltaic module according to an embodiment of the present invention includes a solar cell module 100, a junction box 200, a plate 300 attached to one surface of the solar cell module 100 and disposed between the solar cell module 100 and the junction box 200, and coupling members 350a, 350b, 350c, 350d which penetrate corresponding openings formed in the junction box 200 and are coupled to corresponding coupling grooves formed on the plate 300 (see, for example, FIG. 4). In addition, the photovoltaic module 50 may further include a heat releasing member 400 (see, for example, FIG. 5) disposed between the solar cell module 100 and the plate 300.

First, the solar cell module 100 may include a plurality of solar cells 130. In addition, the solar cell module 100 may further include a first sealing member 120 and a second sealing member 150 positioned on lower and upper surfaces of the plurality of solar cells 130, a rear substrate 110 positioned on a lower surface of the first sealing member 120, and a front substrate 160 positioned on an upper surface of the second sealing member 150.

Each of the solar cells 130 is a semiconductor device converting solar energy into electric energy and may be a silicon solar cell, a compound semiconductor solar cell, a tandem solar cell, a dye-sensitized solar cell, a CdTe or CIGS type solar cell, or the like.

Each of the solar cells 130 is configured to have a light receiving face to which solar light is made incident and a rear face, which is opposite to the light receiving face. For example, each of the solar cells 130 may include a silicon substrate having a first conductivity type, a semiconductor layer formed on the silicon substrate and having a second conductivity type which is opposite to the first conductivity type, an anti-reflective film which includes at least one opening to expose a portion of the second conductivity type semiconductor layer and formed on the second conductivity type semiconductor layer, a front electrode being in contact with the portion of the second conductivity type semiconductor layer exposed through the at least one opening, and a rear electrode formed on a rear surface of the silicon substrate.

The respective solar cells 130 may be electrically connected in series, in parallel, or in series and parallel. In detail, the plurality of solar cells 130 may be electrically connected by a ribbon 133. The ribbon 133 may be bonded to the front electrode formed on a light receiving face of a solar cell and to the rear electrode formed on a rear surface of an adjacent solar cell 130.

In the drawing, it is illustrated that the ribbons 133 are formed in two rows, and the solar cells 130 are connected in a row by the ribbons 133, forming solar cell strings 140. Accordingly, six strings 140a, 140b, 140c, 140d, 140e, and 140f are formed, and each string includes ten solar cells. However, various modifications may be made, unlike that of the drawing.

Meanwhile, the respective solar cell strings may be electrically connected by bus ribbons. FIG. 1 illustrates that the first solar cell string 140a and the second solar cell string 140b, the third solar cell string 140c and the fourth solar cell string 140d, and the fifth solar string 140e and the sixth solar cell string 140f are electrically connected by bus ribbons 145a, 145c, and 145e disposed at a lower portion of the solar cell module 100, respectively. Further, FIG. 1 illustrates that the second solar cell string 140b and the third solar cell string 140c, and the fourth solar cell string 140d and the fifth solar cell string 140e are electrically connected by bus ribbons 145b and 145d disposed at an upper portion of the solar cell module 100, respectively.

Meanwhile, the ribbon connected to the first string, the bus ribbons 145b and 145d, and the ribbon connected to the sixth string are electrically connected to the first to fourth conductive lines 135a, 135b, 135c, and 135d, respectively, and the first to fourth conductive lines 135a, 135b, 135c, and 135d are connected with bypass diodes Da, Db, and Dc (1010 in FIG. 13) within the junction box 200 disposed on the rear surface of the solar cell module 100. In FIG. 1, it is illustrated that the first to fourth conductive lines 135a, 135b, 135c, and 135d are extended to the rear surface of the solar cell module 100 through corresponding openings formed in the solar cell module 100.

The rear substrate 110, as a back sheet, performs functions such as waterproofing, insulating, and filtering of ultraviolet rays. The rear substrate 110 may be a TPT (Tedlar/PET/Tedlar) type rear substrate, but is not limited thereto. Further, in FIG. 3, the rear substrate 110 has a rectangular shape but it may be fabricated to have various shapes such as a circular shape, a semi-circular shape, or the like, according to an environment in which the solar cell module 100 is installed.

Meanwhile, the first sealing member 120 may have the same size as that of the rear substrate 110 and attached to the rear substrate 110, and the plurality of solar cells 130 may be positioned to adjoin each other in several numbers of rows on the first sealing member 120.

The second sealing member 150 is positioned on the solar cells 130 and may be bonded to the first sealing member 120 through lamination.

Here, the first sealing member 120 and the second sealing member 150 may enable respective elements of the solar cells to be chemically bonded. The first sealing member 120 and the second sealing member 150 may be, for example, ethylene vinyl acetate (EVA) film, or the like.

Meanwhile, preferably, the front substrate 160 is positioned on the second sealing member 150 to allow solar light to be transmitted therethrough, and may be tempered glass in order to protect the solar cells 130 against external impact, or the like. Also, more preferably, in order to prevent a reflection of solar light and increase transmittance of solar light, the front substrate may be a low iron tempered glass including a small amount of iron.

The junction box 200 is attached on the rear surface of the solar cell module 100, and may convert the power of the DC power supplied by the solar cell module 100. In detail, the junction box 200 may include a dc/dc converter unit (1030 in FIG. 13) which converts a level of DC power and outputs the same. In addition, the junction box 200 may include bypass diodes Da, Db, and Dc (1010 in FIG. 13) for preventing a back flow of current among solar cell strings. Further, the junction box 200 may further include a capacitor unit (1020 in FIG. 13) which stores the DC power. Further, the junction box 200 may further include an inverter unit (1040 in FIG. 13) for converting DC power into AC power. This will be described later with reference to FIG. 13.

In this manner, the junction box 200 according to an embodiment of the present invention may include at least the bypass diodes Da, Db, and Dc, and the dc/dc converter unit. When the junction box 200 is integrally formed with the solar cell module 100, a loss of DC power generated by each solar cell module 100 may be minimized and effectively managed, like a solar photovoltaic system of FIG. 14 or 15 to be described later.

Meanwhile, as circuit elements in the junction box 200 increase, when one or more circuit elements are damaged, an inconvenience in having to replace the whole integrally formed photovoltaic module 50 may occur. In the embodiment of the present invention, in order to solve the inconvenience, coupling members 350a, 350b, 350c, 350d are used such that the junction box 200 and the solar cell module 100 may be integrally formed, but the junction box 200 may be attached or detached from the solar cell module 100. The explanation about this will be described later with reference to FIG. 4 below.

Meanwhile, in order to prevent an infiltration of moisture into the circuit elements in the junction box 200, the interior of the junction box may be coated with silicon, or the like.

Meanwhile, openings (not shown) are formed on the junction box 200 in order to allow the foregoing first to fourth conductive lines 135a, 135b, 135c, and 135d to be inserted in the respective openings and connected with the bypass diodes Da, Db, and Dc in the junction box 200.

When the junction box 200 operates, heat having a high temperature is generated from the bypass diodes Da, Db, and Dc, or the like. The generated heat may reduce the efficiency of particular solar cells 130 arranged at the position where the junction box 200 is attached.

Thus, in order to prevent the efficiency problem, the photovoltaic module 50 according to an embodiment of the present invention may further include a heat releasing member 400 disposed between the solar cell model 100 and the junction box 200. The explanation about this will be described later with reference to FIG. 5 below.

Meanwhile, an external connection terminal (not shown) may be formed at one side of the junction box 200 in order to output power-converted DC power or AC power to the outside.

FIG. 4 is an example illustrating a cross-sectional view taken along line A-A' of the rear of the photovoltaic module of FIG. 2.

When taking along line A-A' of the rear of the photovoltaic module of FIG. 2, as shown in FIG. 4, the plate 300 and junction box 200 may be disposed on the rear substrate 110 of the solar cell module 100. In this case, the plate 300 and the junction box 200 may be formed so as to be attached and detached by the coupling members 350a, 350b, 350c and 350d.

Meanwhile, an end portion (border) of the plate 300 and a contact surface of the solar cell module 100 may be attached by an adhesive member 213. In addition, the adhesive member 213 and the solar cell module 100 may be attached by applying the adhesive member 213 between the plate 300 and the solar cell module 100. In this case, the adhesive member 213 may use silicon, or the like.

In addition, in order to attach the junction box 200 to the plate 300 by using the coupling members 350a, 350b, 350c and 350d, a cross-sectional area of the plate 300 is preferably larger than that of the junction box 200.

Further, the junction box 200, in particular, the lower surface 207 of the junction box 200 is preferably formed with a plurality of openings. Meanwhile, although the openings are not shown in drawing, it is obvious that the openings are formed at the position where the coupling members 350a, 350b, 350c and 350d are coupled.

Meanwhile, in FIG. 2, although positions of the coupling members 350a, 350b, 350c and 350d are illustrated to be located on four positions at the lower surface of the junction box 200, it is possible to be located on various positions. Further, it is possible to vary the number of positions.

The coupling members 350a, 350b, 350c and 350d are preferably coupled to the coupling grooves formed on the plate 300, as shown in FIG. 4. Although the drawing does not the actual number of the coupling grooves, it illustrates that the end portions of the members 350a and 350b (350c and 350d are not shown) are located on the plate 300.

Meanwhile, in order to dissipate heat generated in the junction box 200, preferably, the plate 300 of FIG. 4 is made of metal materials. For example, the plate 300 may include at least one of gold (Au), silver (Ag), copper (Cu), aluminum (Al), tungsten (W), or the like.

Thus, the junction box 200 and the plate 300 may be attached and detached to or from the solar cell module 100 by coupling the junction box 200 to the plate 100 through the coupling members 350a, 350b, 350c and 350d.

Figure 5:
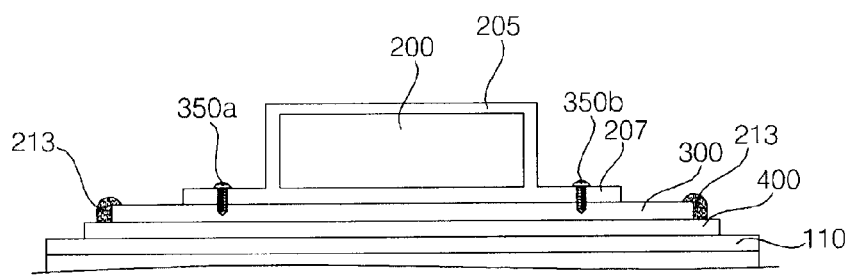
FIG. 5 is another example illustrating a cross-sectional view taken along line A-A' of the rear of the photovoltaic module of FIG. 2.

FIG. 5 is another example illustrating a cross-sectional view taken along line A-A' of the rear of the photovoltaic module of FIG. 2.

When taking along line A-A' of the rear of the photovoltaic module of FIG. 2, as shown in FIG. 5, the heat releasing member 400, the plate 300 and the junction box 200 may be disposed on the rear substrate 110 of the solar cell module 100. When compared with FIG. 4, there is a difference in that the heat releasing member 400 is further disposed between the solar cell module 100 and the plate 300.

In order to dissipate heat generated in the plate 300 and the junction box 200, preferably, the heat releasing member 400 may have a larger sectional area than that of the plate 300. For example, the heat releasing member 400 may be formed on the entirety of the rear surface of the solar cell module 100.

Meanwhile, the heat releasing member 400 is preferably made of a metal material such as gold (Au), silver (Ag), copper (Cu), aluminum (Al), tungsten (W), or the like, which have a better heat conductivity.

Further, an end portion (border) of the plate 300 and a contact surface of the heat releasing member 400 may be attached by the adhesive member 213. In addition, the adhesive member 213 and the solar cell module 100 may be attached by applying the adhesive member 213 between the plate 300 and the heat releasing member 400. Furthermore, the adhesive member 213 may be applied between the heat releasing member 400 and the solar cell module 100.

By using the coupling members 350a, 350b, 350c and 350d, the junction box 200 may be attached and detached to or from the plate 300 by coupling the junction box 200 to the plate 300.

Meanwhile, unlike the drawing, the plate 300 may be further formed with a plurality of openings, in addition to the openings formed in the lower surface 207 of the junction box 200, such that the coupling members 350a, 350b, 350c and 350d may be coupled. Further, corresponding coupling grooves may be formed in the heat releasing member 400.

Figure 6:
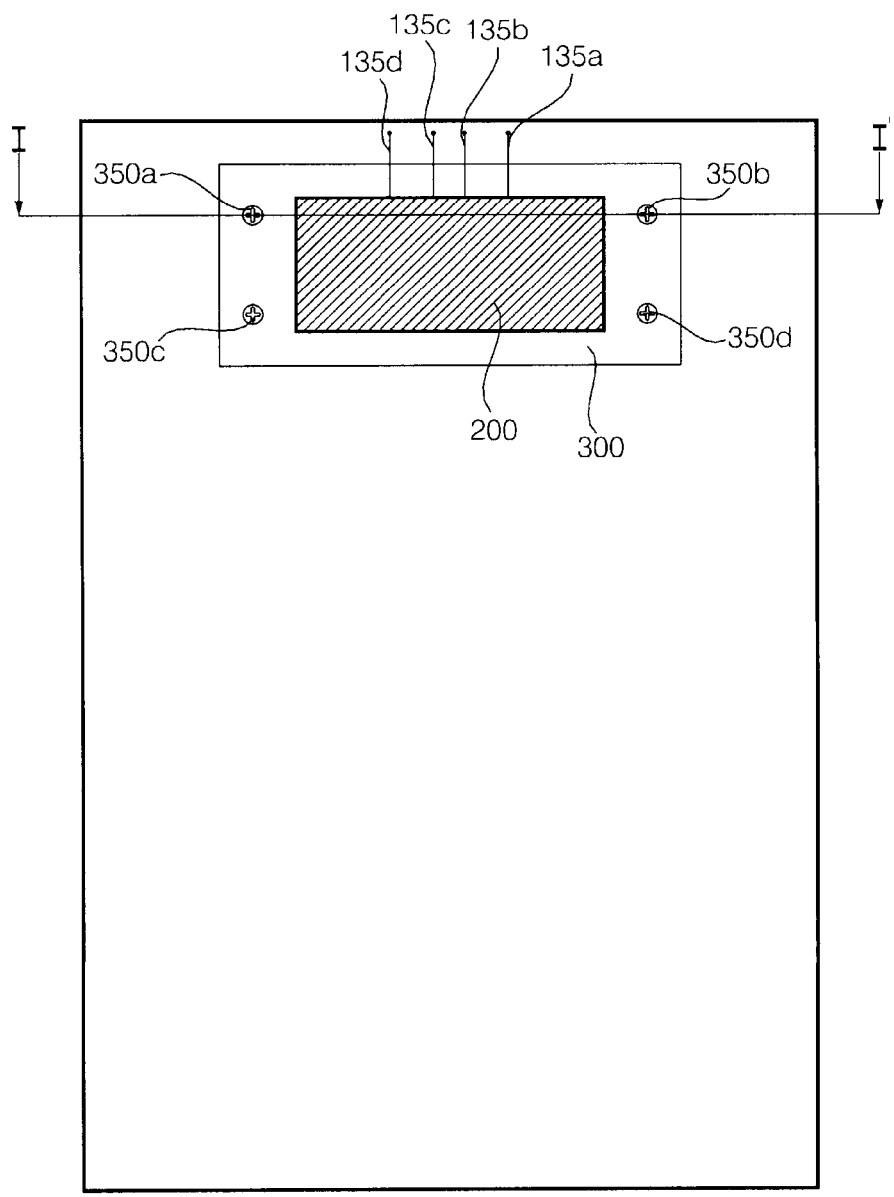
FIG. 6 is another example of the rear view of the photovoltaic module of FIG. 2.

FIG. 6 is another example of the rear view of the photovoltaic module of FIG. 2.

The rear surface of the photovoltaic module shown in FIG. 6 has a configuration that the upper surface and the lower surface of the junction box 200 have the same area, unlike the photovoltaic module shown in FIG. 2.

Accordingly, the photovoltaic module 50 may include the solar cell module 100, the junction box 200 located on one surface of the solar cell module 100, the plate 300 attached to the junction box 200 to be disposed between the solar cell module 100 and the junction box 200, and the coupling members 350a, 350b, 350c and 350d penetrating the openings formed on the plate 300 and coupled to the respective coupling grooves formed in the solar cell module 100. In addition, the photovoltaic module 50 may further include the heat releasing member 400 disposed between the solar cell module 100 and the plate 300.

Figure 7:
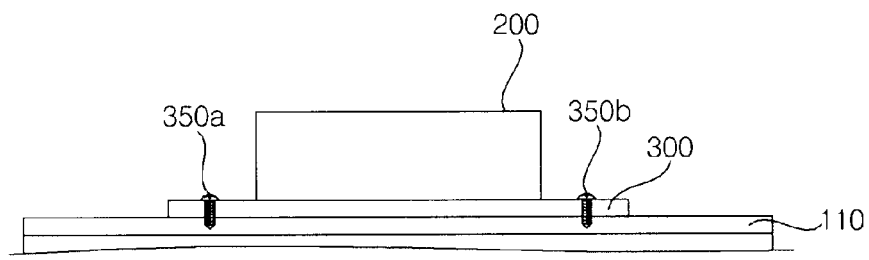
FIG. 7 is an example illustrating a cross-sectional view taken along line I-I' of the photovoltaic module of FIG. 6.

FIG. 7 is an example illustrating a cross-sectional view taken along line I-I' of the photovoltaic module of FIG. 6.

When taking along line I-I' of the rear surface of the photovoltaic module of FIG. 6, as shown in FIG. 7, the plate 300 and junction box 200 may be disposed on the rear substrate 110 in the solar cell module 100. In this case, the plate 300 and the junction box 200 may be integrally formed. The bottom surface of the junction box 200 and the plate 300 may be integrally formed. In addition, the plate 300 and the junction box 300 may be attached together by the adhesive member.

Meanwhile, in order to attach the junction box 200 to the solar cell module 100 by using the coupling members 350a, 350b, 350c and 350d, a cross-sectional area of the plate 300 is preferably larger than that of the junction box 200. Further, the plate 300 is preferably formed with a plurality of openings so as to be coupled with a plurality of coupling members 350a, 350b, 350c and 350d. Although the openings are not shown in drawing, it is obvious that the openings are formed at the position where the coupling members 350a, 350b, 350c and 350d are coupled.

Meanwhile, in FIG. 6, although positions of the coupling members 350a, 350b, 350c and 350d are illustrated to be located on areas corresponding to four corners of the junction box 200, it is possible to be located on various positions. Further, it is possible to vary the number of positions.

The coupling members 350a, 350b, 350c and 350d are preferably coupled to the coupling grooves formed in the solar cell module 100, as shown in the drawing. Although the drawing does not show the actual number of the coupling grooves, it is illustrated that the end portions of the members 350a and 350b (350c and 350d are not shown) are located on the rear substrate 110 of the solar cell module 100.

Meanwhile, in the solar cell module 100, the coupling grooves may be preferably formed on only the rear substrate 110 of the solar cell module 100. This is to prevent damage of the solar cell module 130.

Meanwhile, in order to dissipate heat generated in the junction box 200, preferably, the plate 300 of FIG. 7 is made of metal materials. For example, the plate 300 may include at least one of gold (Au), silver (Ag), copper (Cu), aluminum (Al), tungsten (W), or the like.

By using the coupling members 350a, 350b, 350c and 350d, the junction box 200 and the plate 300 may be easily attached and detached to or from the solar cell module 100 by coupling the plate 300 attached to the junction box 200 with the solar cell module 100.

Figure 8:
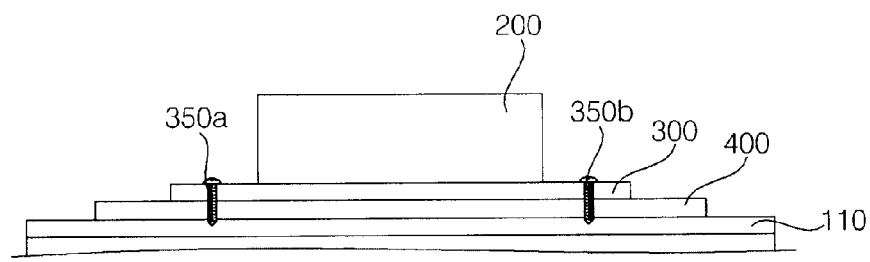
FIG. 8 is another example illustrating a cross-sectional view taken along line I-I' of the photovoltaic module of FIG. 6.

FIG. 8 is another example illustrating a cross-sectional view taken along line I-I' of the photovoltaic module of FIG. 6.

When taking along line I-I' of the rear of the photovoltaic module of FIG. 6, as shown in FIG. 8, the heat releasing member 400, the plate 300 and the junction box 200 may be disposed on the rear substrate 110 in the solar cell module 100. When compared with FIG. 7, there is a difference in that the heat releasing member 400 is further disposed between the solar cell module 100 and the plate 300.

When explaining on the basis of the difference, the heat releasing member 400 is preferably formed with a plurality of openings so as to be coupled with a plurality of coupling members 350a, 350b, 350c and 350d, in addition to the plurality of openings formed in plate 300. In this case, positions of the plurality of openings formed on the heat releasing member 400 may correspond to positions of the plurality of openings formed on the plate 300.

Meanwhile, in order to dissipate heat generated in the plate 300 and the junction box 200, preferably, the heat releasing member 400 may have a larger sectional area than that of the plate 300. For example, the heat releasing member 400 may be formed on the entirety of the rear surface of the solar cell module 100.

Meanwhile, the heat releasing member 400 is preferably made of a metal material such as gold (Au), silver (Ag), copper (Cu), aluminum (Al), tungsten (W), or the like, which have a better heat conductivity.

In addition, as shown in FIG. 7, FIG. 8 is illustrating that the end portions of the members 350a and 350b (350c and 350d are not shown) are located on the rear substrate 110 of the solar cell module 100. Accordingly, damage of the solar cell module 130 may be prevented. By using the coupling members 350a, 350b, 350c and 350d, the junction box 200, the plate 300 and the heat releasing member 400 may be easily attached and detached to or from the solar cell module 100 by coupling the plate 300 attached to the junction box 200 and the heat releasing member 400 attached to the plate 300 with the solar cell module 100.

Figure 9:
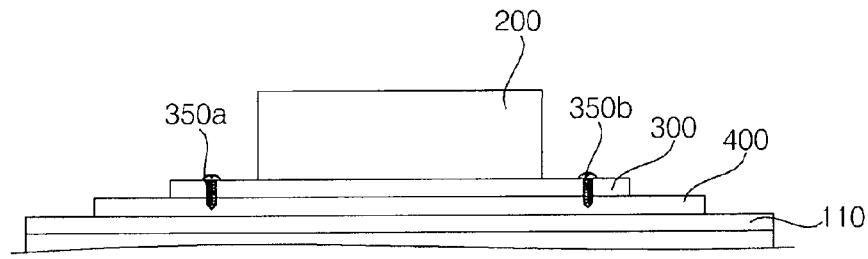
FIG. 9 is still another example illustrating a cross-sectional view taken along line I-I' of the photovoltaic module of FIG. 6.

FIG. 9 is still another example illustrating a cross-sectional view taken along line I-I' of the photovoltaic module of FIG. 6.

When taking along line I-I' of the rear surface of the photovoltaic module of FIG. 6, as shown in FIG. 9, the heat releasing member 400, the plate 300 and the junction box 200 may be disposed on the rear substrate 110 in the solar cell module 100.

When comparing with FIG. 8, it is illustrated that the end portions of the members 350a and 350b (350c and 350d are not shown) are located on the heat releasing member 400 of the solar cell module 100. That is, it is illustrated that the coupling groove is located on the heat releasing member 400, not the rear substrate 100 of the solar cell module 100.

In this case, the heat releasing member 400 and the solar cell module 100, especially the rear substrate 110 of the solar cell module 100 may be attached by the adhesive member.

According to the structure of FIG. 9, since the coupling grooves are not formed in the solar cell module 100 itself, the damage of the solar cell module 100 can be prevented.

Meanwhile, by using the coupling members 350a, 350b, 350c and 350d, the junction box 200 and the plate 300 may be easily attached and detached to or from the solar cell module 100 by coupling the plate 300 attached to the junction box 200 with the heat releasing member 140 attached to the solar cell module 100.

Figure 10:
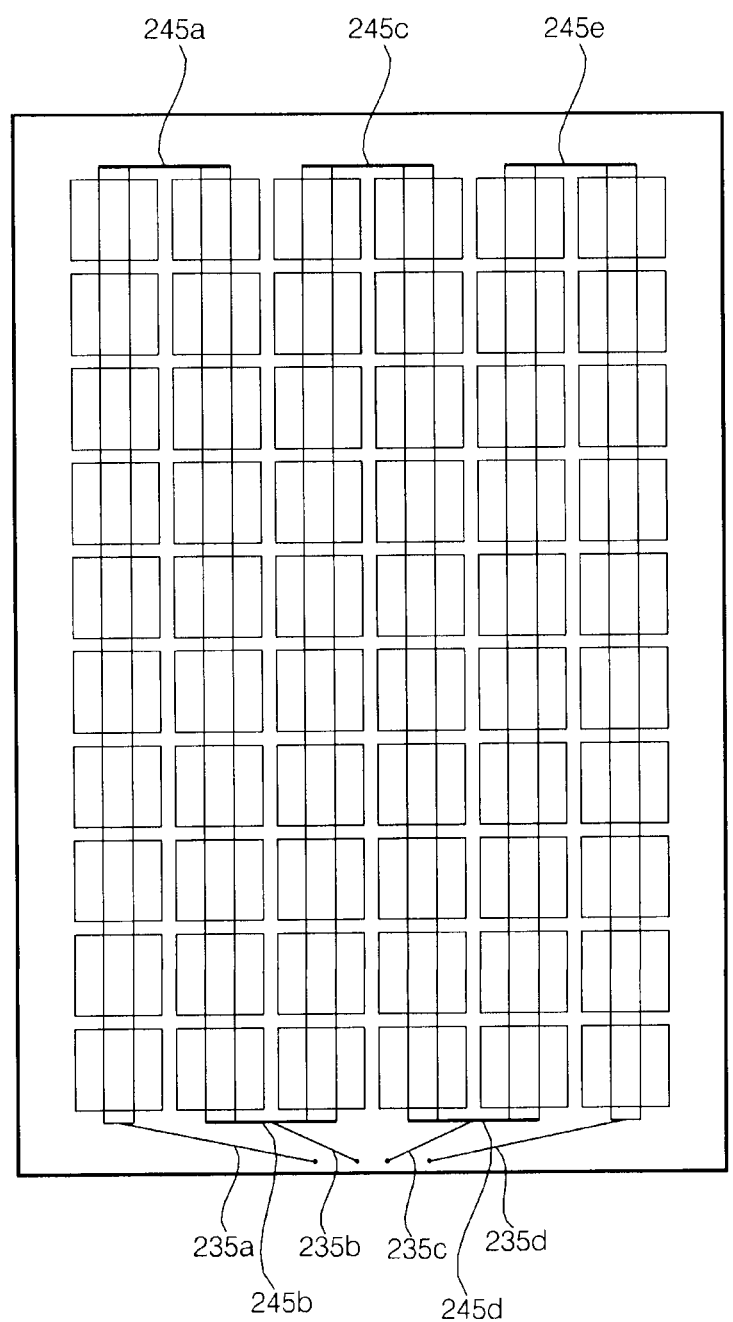
FIG. 10 is a front view of a photovoltaic module according to an embodiment of the present invention.
Figure 11:
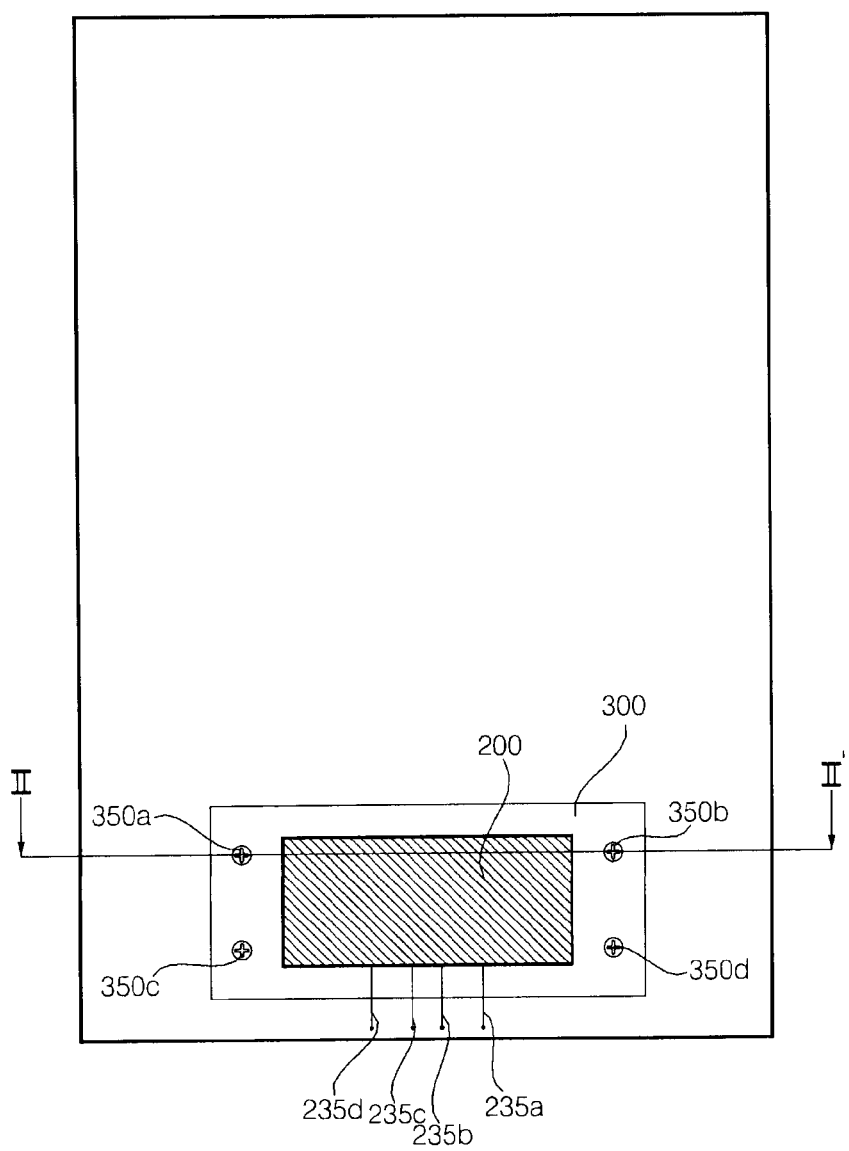
FIG. 11 is a rear view of the photovoltaic module of FIG. 10.

FIG. 10 is a front view of a photovoltaic module according to an embodiment of the present invention, and FIG. 11 is a rear view of the photovoltaic module of FIG. 10.

Referring to the drawings, the photovoltaic module 50 of FIG. 10 and FIG. 11 is similar to the photovoltaic module 50 of FIGS. 1 to 6, but there is a difference in that the location of the bus ribbon and directions extended by the first to fourth conductive lines are opposite, when compared with the photovoltaic module 50 of FIGS. 1 to 6.

That is, it is illustrated that the first solar cell string 140a and the second solar cell string 140b, the third solar cell string 140c and the fourth solar cell string 140d, and the fifth solar string 140e and the sixth solar cell string 140f are electrically connected by bus ribbons 245a, 245c, and 245e disposed at a upper portion of the solar cell module 100, respectively. Further, it is illustrated that the second solar cell string 140b and the third solar cell string 140c, and the fourth solar cell string 140d and the fifth solar cell string 140e are electrically connected by bus ribbons 245b and 245d disposed at a lower portion of the solar cell module 100, respectively.

Meanwhile, the ribbon connected to the first string, the bus ribbons 245b and 245d, and the ribbon connected to the sixth string are electrically connected to the first to fourth conductive lines 235a, 235b, 235c, and 235d, respectively, and the first to fourth conductive lines 235a, 235b, 235c, and 235d are connected with bypass diodes Da, Db, and Dc (1010 in FIG. 13) within the junction box 200 disposed on the rear surface of the solar cell module 100. In the drawing, it is illustrated that the first to fourth conductive lines 235a, 235b, 235c, and 235d are extended to the rear surface of the solar cell module 100 through openings formed on the solar cell module 100.

Meanwhile, the junction box is preferably disposed to be closer to an end portion, to which the conductive lines extend, among both end portions of the solar cell module 100.

In FIGS. 10 and 11, since the first to fourth conductive lines 235a, 235b, 235c, and 235d are extended from the lower portion of the solar cell module 100 to the rear surface of the solar cell module 100, it is illustrated that the junction box 200 is located on the lower portion of the rear surface of the solar cell module 100. Accordingly, since length of the conductive lines may be reduced, the power losses may be reduced.

Meanwhile, in FIGS. 1 to 6, since the first to fourth conductive lines 135a, 135b, 135c, and 135d are extended from the upper portion of the solar cell module 100 to the rear surface of the solar cell module 100, it is illustrated that the junction box 200 is located on the upper portion of the rear surface of the solar cell module 100. Accordingly, since length of the conductive lines may be reduced, the power losses may be reduced.

Figure 12:
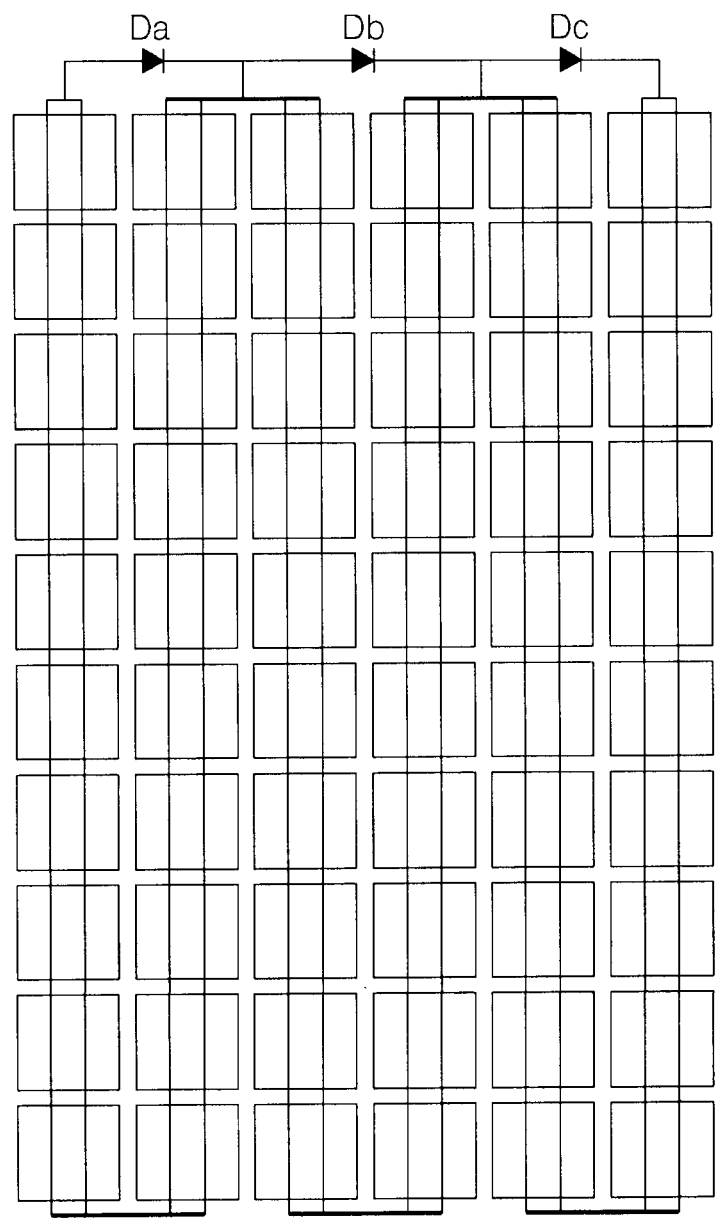
FIG. 12 is an example illustrating a configuration of bypass diodes of the photovoltaic module of FIG. 1.

FIG. 12 is an example illustrating a configuration of bypass diodes of the photovoltaic module of FIG. 1.

With reference to FIG. 12, the bypass diodes Da, Db, Dc may be connected correspondingly according to the six solar cell strings 140a, 140b, 140c, 140d, 140e, and 140f. In detail, the first bypass diode Da is connected between the first solar cell string and the first bus ribbon 145a to bypass the first solar cell string 140a and the second solar cell string 140b when a reverse voltage occurs in the first solar cell string 140a or the second solar cell string 140b.

For example, when a voltage of about 0.6V, which is generated in a normal solar cell, is generated, the potential of a cathode electrode of the first bypass diode Da is higher by about 12V (=0.6V*20) than that of an anode electrode of the first bypass diode Da. Namely, the first bypass diode Da performs a normal operation, rather than a bypassing operation.

Meanwhile, when a hot spot occurs such as when shade occurs in a solar cell of the first solar cell string 140a or when a foreign object is attached, a reverse voltage (about −15V), not the voltage of about 0.6V, is generated from a solar cell. Accordingly, the potential of the anode electrode of the first bypass diode Da is higher by about 15V than that of the cathode electrode. Then, the first bypass diode Da performs a bypassing operation. Thus, the voltage generated in the solar cells in the first solar cell string 140a and the second solar cell string 140b is not supplied to the junction box 200. In this manner, when a reverse voltage is generated in some of the solar cells, it is bypassed, thus preventing the corresponding solar cells, or the like, from being damaged. Also, generated DC power may be supplied, except for the hot spot area.

Next, the second bypass diode Db is connected between the first bus ribbon 145b and the second bus ribbon 145d, and when a reverse voltage is generated in the third solar cell string 140c or the fourth solar cell string 140d, the second bypass diode Db bypasses the third solar cell string 140c and the fourth solar cell string 140d.

Next, the third bypass diode Dc is connected between the sixth solar cell string and the second bus ribbon 145b, and when a reverse voltage is generated in the fifth solar cell string 140e or the sixth solar cell string 140f, the third bypass diode Dc bypasses the fifth solar cell string 140e and the sixth cell string 140f.

Meanwhile, unlike the case of FIG. 12, six bypass diodes may be connected correspondingly according to six solar cell strings, and various other modifications may also be implemented.

Figure 13:
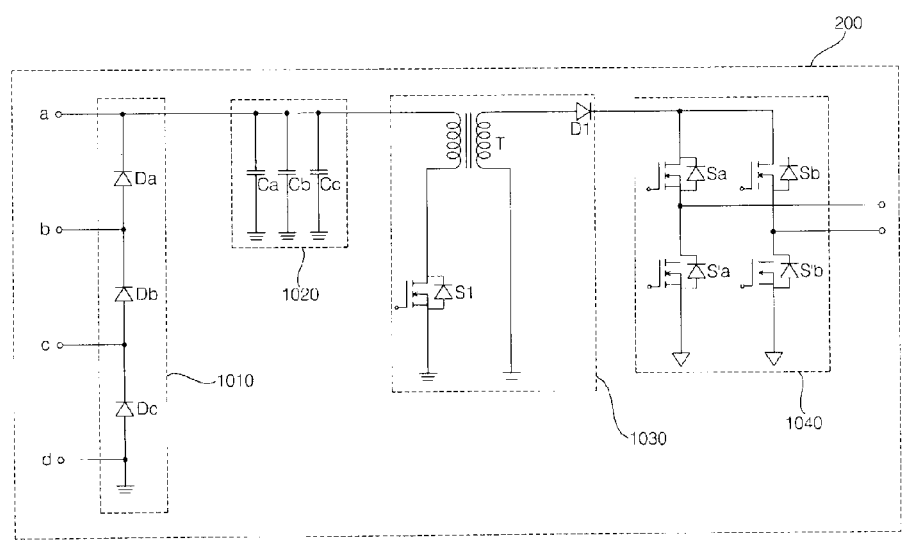
FIG. 13 is an example illustrating an internal circuit diagram of a junction box of the photovoltaic module of FIG. 1.

FIG. 13 is an example illustrating an internal circuit diagram of a junction box of the photovoltaic module of FIG. 1.

The junction box 200 may include a bypass diode unit 1010 and a dc/dc converter unit (1030). In addition, the junction box 200 may further include a capacitor unit 1020 and inverter unit 1040.

For example, when the junction box 200 includes the bypass diode unit 1010, the capacitor unit 1020 and a dc/dc converter unit 1030, except for the inverter unit 1040, the junction box outputs DC power. In this case, the junction box 200 performs a power optimizing function, and the junction box 200 is referred to as a power optimizer. Power optimizing will be described with reference to FIGS. 15, 16A and 16B below.

Meanwhile, when the junction box 200 includes the inverter unit 1040, the junction box 200 outputs AC power. Such a junction box 200 may be called a micro-inverter. This will be described with reference to FIG. 14 below.

The bypass diode unit 1010 includes first to third bypass diodes Da, Db, and Dc disposed between a, b, c, and d nodes which correspond to the first to fourth conductive lines 135a, 135b, 135c, and 135d, respectively.

During a normal operation, DC power supplied from the solar cell module 100 including sixty solar cells may be about 36V (0.6V*60). Meanwhile, when the first bypass diode Da performs a bypassing operation, DC power supplied from the solar cell module 100 including sixty solar cells may be about 24V (0.6V*40)

The capacitor unit 1020 stores DC power supplied from the solar cell module 100. In the drawing, it is illustrated that three capacitors Ca, Cb, and Cc are connected in parallel, but the capacitor unit is not limited thereto and the three capacitors may be connected in series or may be connected in series and parallel.

The dc/dc converter unit 1030 performs level of DC output conversion by using the DC power stored in the capacitor unit 1020. In the drawing, a flyback converter using a turn-on timing of a switching element S1 and a winding ratio of a transformer T is illustrated. Accordingly, voltage boosting of a dc level may be performed.

Meanwhile, a converter control unit (not shown) for controlling the turn-on timing of the switching element S1 may be further included. In addition, a current detection unit (not shown) which detects current input to the capacitor unit 1020 and voltage detection unit (not shown) which detects voltage across the capacitor unit 1020 may be further included, and the detected current and voltage may be used for the turn-on timing of a switching element S1. Further, based on the turn-on timing of the switching element, a power optimizing control of the respective solar cell modules, which is described later, may be performed.

Meanwhile, besides the flyback converter illustrated in the drawing, a boost converter, a buck converter, a forward converter, or the like, may also be used as the dc/dc converter unit 1030, or a combination thereof (e.g., a cascaded buck-boost converter, or the like) may also be used as the dc/dc converter unit 1030.

The inverter unit 1040 converts the level-converted DC power into AC power. In the drawing, a full-bridge inverter is illustrated. That is, upper arm switching elements Sa and Sb connected in series and lower arm switching elements S'a and S'b connected in series are paired, and a total of two pairs of upper and lower arm switching elements are connected in parallel (Sa&S'a, Sb&S'b). Diodes are connected reversely parallel to the respective switching elements Sa, S'a, Sb, and S'b.

The switching elements in the inverter unit 1040 are turned on or off based on an inverter switching control signal from an inverter controller (not shown). Accordingly, AC power having a certain frequency is outputted. Preferably, the AC power has the same frequency (about 60 Hz) as an AC frequency of grid.

Figure 14:
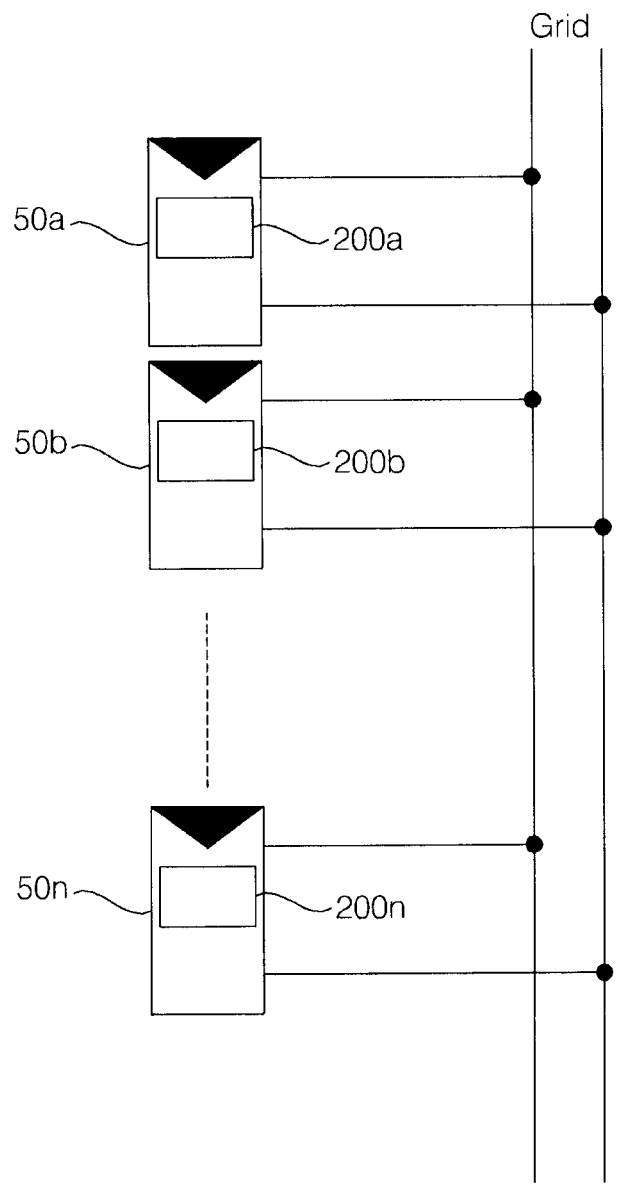
FIG. 14 is an example illustrating the configuration of a solar photovoltaic system according to an embodiment of the present invention.

Meanwhile, a capacitor unit (not shown) for storing the level-converted dc power may be further provided between the dc/dc converter unit 1030 and the inverter unit 1040. The capacitor unit (not shown) may include a plurality of capacitors, like the foregoing capacitor unit 1020. FIG. 14 is an example illustrating the configuration of a solar photovoltaic system according to an embodiment of the present invention.

Referring to the drawing, the solar photovoltaic system of FIG. 14 includes a plurality of photovoltaic modules 50a, 50b, ..., 50n. The photovoltaic modules 50a, 50b, ..., 50n may include junction boxes 200a, 200b, ..., 200n outputting AC power, respectively. In this case, the junction boxes 200a, 200b, ..., 200n may be micro-inverters, and AC power output from the respective junction boxes 200a, 200b, ..., 200n is supplied to a grid.

Figure 15:
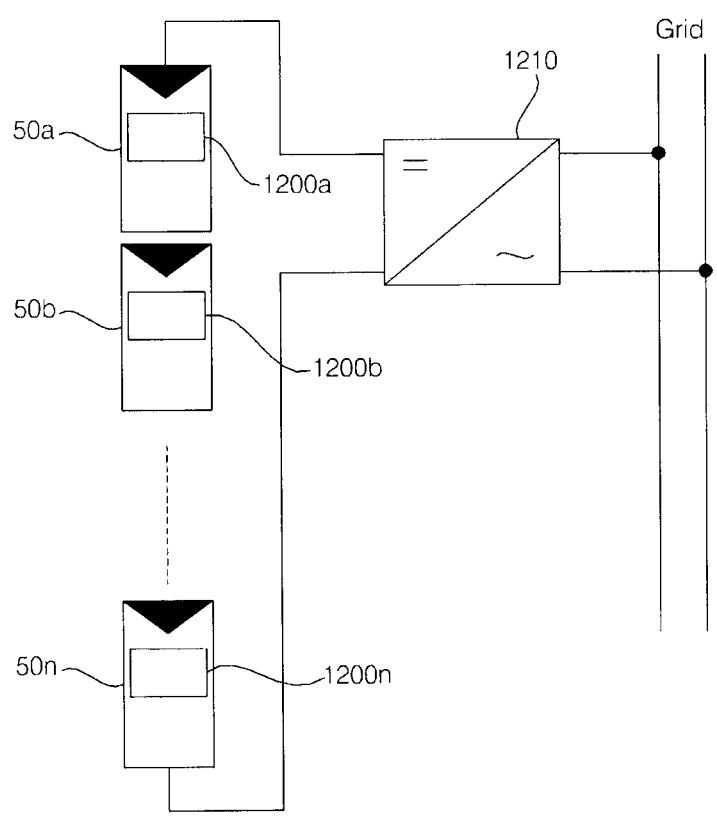
FIG. 15 is another example illustrating the configuration of a solar photovoltaic system according to an embodiment of the present invention.

Meanwhile, the coupling structure of the junction box 200 illustrated in FIGS. 4 to 9 according to an embodiment of the present invention may be applied to the micro-inverter of FIG. 14. FIG. 15 is another example illustrating the configuration of a solar photovoltaic system according to an embodiment of the present invention.

Referring to the drawing, the solar photovoltaic system of FIG. 15 includes a plurality of photovoltaic modules 50*a*, 50*b*, . . . , 50*n*. The photovoltaic modules 50*a*, 50*b*, . . . , 50*n* may include junction boxes 1200*a*, 1200*b*, . . . , 1200*n* outputting DC power, respectively. In addition, an inverter unit 1210 for converting DC power output from the respective photovoltaic modules 50*a*, 50*b*, . . . , 50*n* into AC power may be further provided. In this case, the junction boxes 1200*a*, 1200*b*, . . . , 1200*n* may perform power optimizing in order to effectively output DC power. This will be described later with reference to FIG. 16 below.

Meanwhile, the coupling structure of the junction box 200 illustrated in FIGS. 4 to 9 according to an embodiment of the present invention may be applied to the micro-inverter of FIG. 15.

Figure 16A:
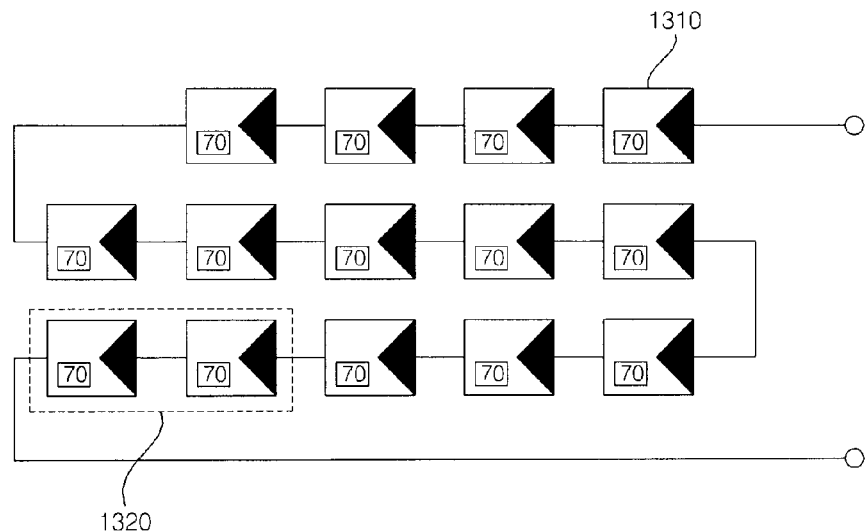
FIGS. 16A and 16B are schematic diagrams referred to in explaining power optimization of the solar photovoltaic system according to an embodiment of the present invention.
Figure 16B:
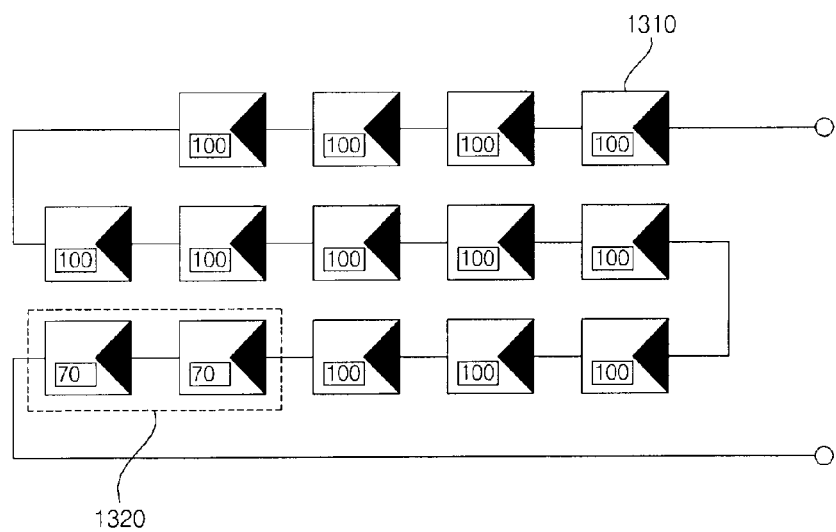

FIGS. 16A and 16B are schematic diagrams referred to in explaining power optimizing of the solar photovoltaic system according to an embodiment of the present invention.

First, a case in which power optimizing is not employed will now be described with reference to FIG. 16A. As illustrated, in a state in which a plurality of solar cell modules are connected in series, when a hot spot occurs in solar cell modules 1320 so that a power loss is made (e.g., 70 W power supply), a power loss is also made even in a normal solar cell module 1310 (e.g., 70 W power supply). Thus, only power totaling 980 W is supplied.

Next, a case in which power optimizing is employed will now be described with reference to FIG. 16B. When a hot spot occurs in solar cell modules 1320 so that a power loss is made (e.g., 70 W power supply), voltage output from the corresponding solar cell modules 1320 is lowered so that current supplied from the corresponding solar cell modules 1320 can be equal to the current supplied from a different solar cell module 1310. Thus, although a power loss (e.g., 70 W power supply) is made in the solar cell modules 1320 in which a hot spot occurs, there is no power loss in the normal solar cell module 1310 (e.g., 100 W power supply. Thus, power totaling 1340 W can be supplied.

Through power optimizing, the voltage supplied from a solar cell module in which a hot spot occurs may be adjusted according to the current supplied from a different solar cell module. To this end, each of the solar cell modules may control a voltage output, or the like, on its own upon receiving a current value or a voltage value supplied from a different solar cell module.

Meanwhile, the coupling structure of the junction box 200 illustrated in FIGS. 4 to 9 according to an embodiment of the present invention may be applied to the power optimizing of FIG. 16B.

According to embodiments of the present invention, a photovoltaic module is capable of easily attaching or detaching a junction box in the photovoltaic module by coupling a coupling member to an opening formed in a junction box and a coupling groove formed in a plate.

Meanwhile, when including a converter unit which converts the level of DC power in the junction box, it is possible to provide a DC power level-changed in the photovoltaic module. In this case, when a circuit element in the converter unit is damaged, the junction box may be replaced according to an attachment and detachment structure by the coupling member.

In addition, heat generated in the junction box may be distributed through a plate formed by metal materials.

Further, heat generated in the junction box may be distributed through a heat releasing member formed by metal materials.

The photovoltaic module according to the embodiments of the present disclosure is not limited in its application of the configurations and methods, but the entirety or a portion of the embodiments may be selectively combined to be configured into various modifications.

In addition, as the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A photovoltaic module comprising:
a solar cell module including a plurality of solar cells;
a junction box including a plurality of bypass diodes and a dc/dc converter unit to convert a level of DC power supplied from the solar cell module;
a plate on one surface of the solar cell module between the solar cell module and the junction box; and
a coupling member attaching and detaching the junction box from the solar cell module,
wherein the solar cell module further includes a plurality of solar cell strings formed with some of the plurality of solar cells connected in a row, and a plurality of conductive lines electrically connecting the plurality of solar cell strings and the plurality of bypass diodes within the junction box,
wherein the plurality of conductive lines are extended to a rear surface of the solar cell module through corresponding openings formed in the solar cell module.

2. The photovoltaic module of claim 1, wherein the plate includes a coupling groove to couple the coupling member to the plate.

3. The photovoltaic module of claim 1, wherein the junction box further includes a first surface, a second surface having a larger area than that of the first surface, and an opening on the second surface through which at least a portion of the coupling member passes through the junction box.

4. The photovoltaic module of claim 1, further comprising:
an adhesive member covering an end portion of the plate and a contact surface of the solar cell module.

5. The photovoltaic module of claim 1, further comprising:
a heat releasing member between the plate and the solar cell module.

6. The photovoltaic module of claim 5, wherein the heat releasing member has a larger area than that of the plate.

7. The photovoltaic module of claim 5, wherein the heat releasing member includes a coupling groove to couple the coupling member to the heat releasing member.

8. The photovoltaic module of claim 5, wherein the heat releasing member includes an opening to pass at least a portion of the coupling member through the heat releasing member.

9. The photovoltaic module of claim 5, further comprising:
an adhesive member covering an end portion of the plate and a contact surface of the heat releasing member.

10. The photovoltaic module of claim 1, wherein the solar cell module further includes a rear substrate including a coupling groove to couple the coupling member to the rear substrate.

11. The photovoltaic module of claim 8, wherein the solar cell module further includes a rear substrate including a coupling groove to couple the coupling member to the rear substrate.

12. The photovoltaic module of claim 1, wherein the solar cell module further includes a first sealing member and a second sealing member on lower and upper surfaces of the plurality of solar cells, a rear substrate on a lower surface of the first sealing member, and a front substrate on an upper surface of the second sealing member.

13. The photovoltaic module of claim 5, wherein the heat releasing member includes at least one of gold (Au), silver (Ag), copper (Cu), aluminum (Al), and tungsten (W).

14. The photovoltaic module of claim 1, wherein the plate includes at least one of gold (Au), silver (Ag), copper (Cu), aluminum (Al), and tungsten (W).

15. The photovoltaic module of claim 1, wherein the junction box is closer to an end portion, to which the conductive lines extend, among both end portions of the solar cell module.

16. The photovoltaic module of claim 1, wherein the junction box further includes a bypass diode between two strings of the solar cells and configured to bypass the two strings of the solar cells when a reverse voltage occurs, among the plurality of solar cells in the two strings of the solar cells.

17. The photovoltaic module of claim 1, wherein the junction box further includes a capacitor unit configured to store the DC power supplied from the solar cell module.

18. The photovoltaic module of claim 1, wherein the junction box further includes an inverter unit configured to convert the level-converted DC power into AC power.

19. The photovoltaic module of claim 1, wherein the dc/dc converter unit includes a flyback converter.

20. The photovoltaic module of claim 11, wherein the junction box further includes a capacitor unit and an inverter unit to convert level-converted DC power into AC power.

* * * * *